June 30, 1959 R. E. COLWELL 2,892,965
IMPULSE OPERATION TYPES OF ELECTRIC WIRING STRUCTURES
Filed Oct. 3, 1955 2 Sheets-Sheet 1
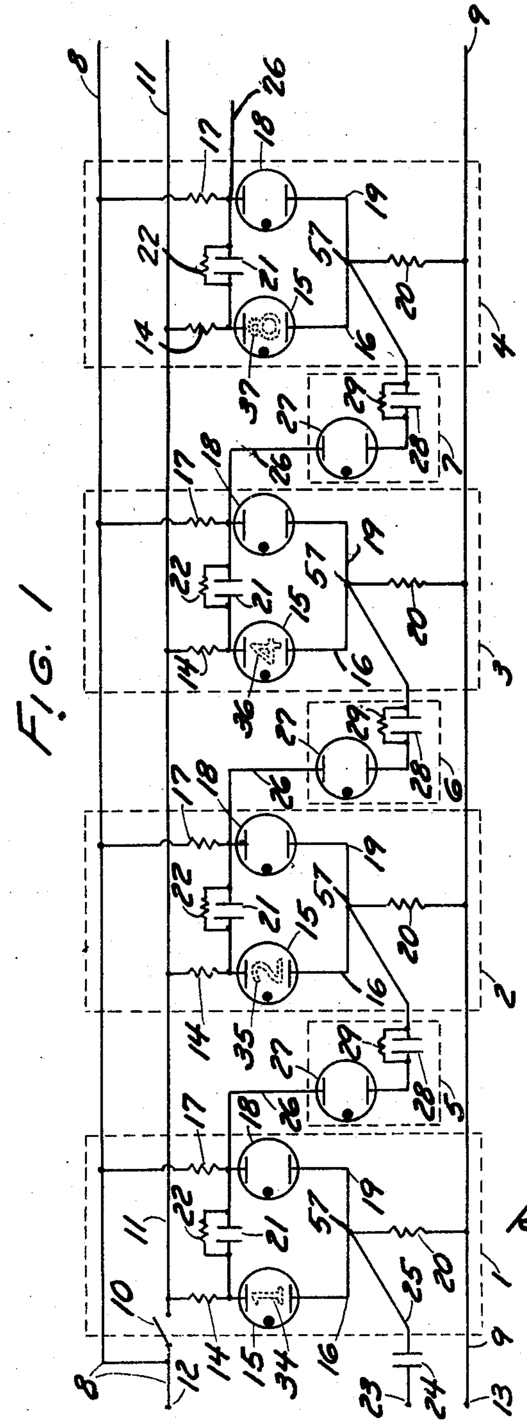
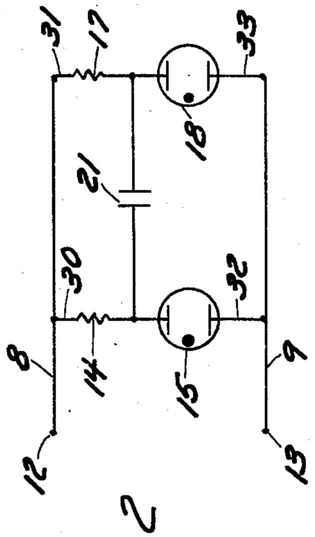
FIG. 2
RICHARD E. COLWELL
Inventor
By [signature]
Atty.

June 30, 1959 R. E. COLWELL 2,892,965

IMPULSE OPERATION TYPES OF ELECTRIC WIRING STRUCTURES

Filed Oct. 3, 1955 2 Sheets-Sheet 2

RICHARD E. COLWELL
Inventor

By [signature]

Atty.

United States Patent Office 2,892,965
Patented June 30, 1959

2,892,965

IMPULSE OPERATION TYPES OF ELECTRIC WIRING STRUCTURES

Richard E. Colwell, Oakwood, Ohio

Application October 3, 1955, Serial No. 537,979

15 Claims. (Cl. 315—84.5)

Figure 3:
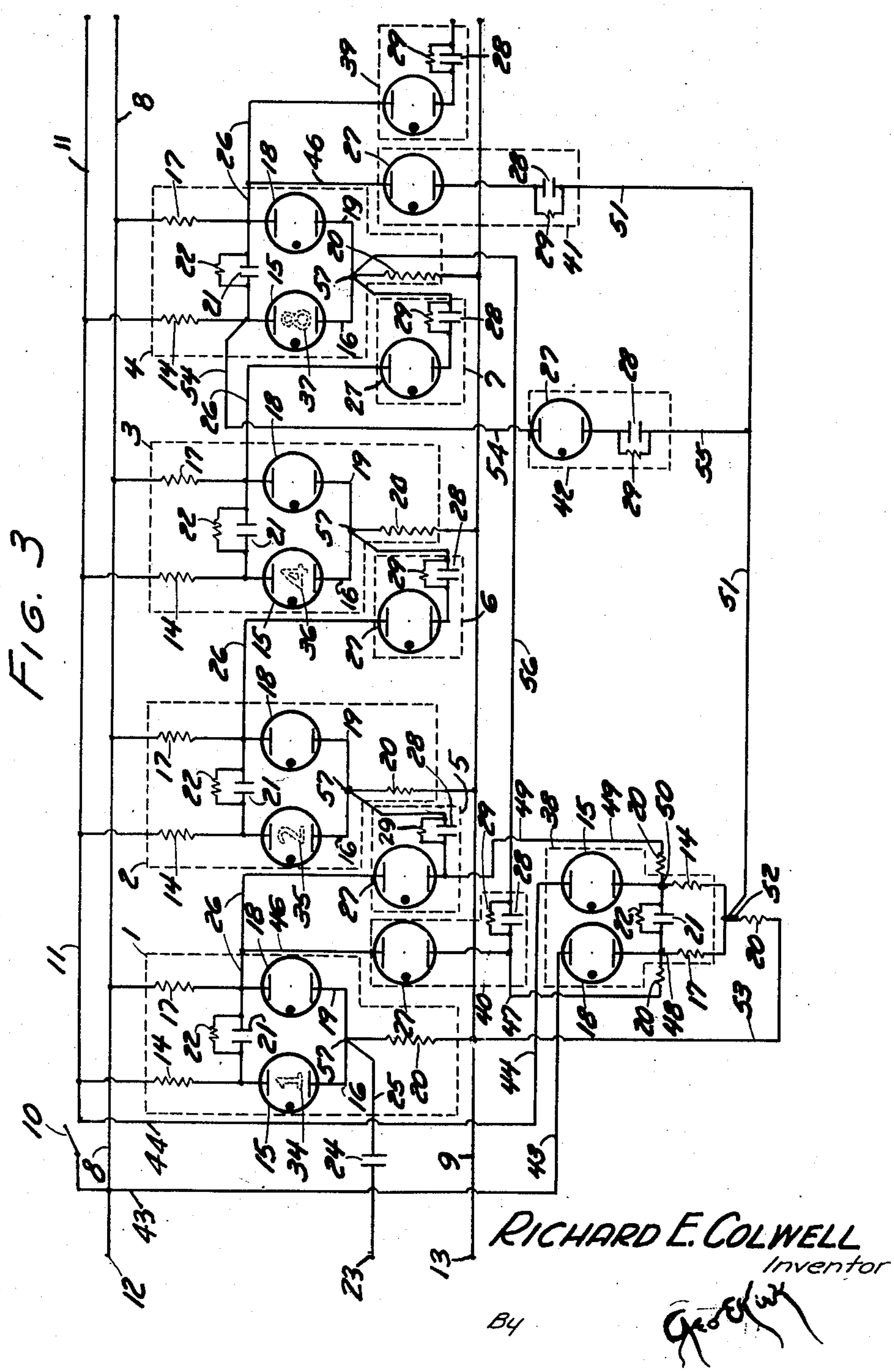

This invention relates to condition disclosing, detecting, signaling, as well as for scaling, dividing, counting and analogous adaptations, especially where sequence may be a factor.

This invention has utility when incorporated in electric wiring structures, more particularly those concerning gas diodes for alternate or selective ionizing. Through the control of potential limits, efficient flip flop assemblies are developed. Such developing may be supplemented by gas diodes functioning between flip flops as an impulse transmitting coupler. The flip flops and couplers may be variously grouped, as in binary and decimal counting systems.

Referring to the drawings:

Fig. 1 is a wiring diagram layout of a four-flip-flop three-coupler structure of gas diodes, in itself disclosing notation development, as in binary counting;

Fig. 2 is a wiring diagram of a pair of gas diodes in a circuit relation for discontinuous or interrupted ionization of the gas diodes as alternating; and Fig. 3 is a wiring diagram involving development somewhat away from binary counting, showing development from the four-flip-flop three-coupler structure of gas diodes (Fig. 1) with four additional couplers and one additional flip flop, thereby adapting the structure to decimal notation or decade counting.

*The flip flop*

The wiring structure (Fig. 1) comprises in series similar flip flops 1, 2, 3, 4, with couplers 5, 6, 7. Direct electric current supply is by a first conductor 8 and a second takeoff conductor 9 somewhat in the arrangement of bus-bar. A switch 10, normally closed, locates a supply line 11 in parallel with the conductor 8. The conductor 8 has a lead-in supply terminal 12 and the conductor 9 has a similar terminal 13.

At the respective flip flops 1, 2, 3, 4, the supply line 11 is connected through a first resistor 14 to gas diodes 15 in a first circuit branch 16, while from the supply line conductor 8 are second resistors 17 to gas diodes 18 in a second branch circuit 19 in-parallel with the branch 16. These branches 16, 19, have a junction 57 for circuit completion therefrom through a third resistor 20 to the second conductor 9.

On the sides of the gas diodes 15, 18, toward the resistors 14, 17, there is a capacitor 21 in parallel with a fourth resistor 22. With luminosity, due to its being in an ionized state, the diode 15 of the flip flop 1 may have a notation "1" 34; the flip flop 2 diode 15 a notation "2" 35; the flip flop 3 diode 15 a notation "4" 36; the flip flop 4 diode 15 a notation "8" 37, as for binary adaptation, in thereby completing the several flip flops for functioning in the disclosure herein.

Impulse transmission may now be taken into account as from a terminal 23, through a second capacitor 24 by a connection 25 to the junction 57.

*The couplers 5, 6, 7*

From the side of the diodes 18 toward the resistors 17, connections 26 (from the branches 19) extend to gas diodes 27 having a third capacitor 28 in parallel with a fifth resistor 29. Analogous to the impulse transmitting connection 25 to the flip flop 1, the coupler connections

26 to the following flip flop supply impulses to such flip flops 2, 3, 4, via junctions 57.

The impulse transmission between the gas diode 15 and the gas diode 18, when the gas diode 15 de-ionizes and the gas diode 18 ionizes, may be transmitted through the gas diode 27 which is connected in series with the capacitor 28 and its in-parallel resistor 29 to serve as the coupler impulse transmitting means from the conductor 26 of the branch 19 of the flip flop 1 to the branches 16, 19, of the flip flop 2.

While this impulse transmitter coupler has the connection 26 to the resistor 17 side of the gas diode 18, its through connection from the capacitor 28 which is in parallel with the resistor 29 is to the junction 57 in the flip flop 2. The gas diode 27 in the coupler in its impulse transmission connection to the gas diodes of the follower flip flop, has such cycling as instantaneous due to the capacitor 28 and its in-parallel resistor 29.

*Discontinuous or alternating operation*

While a pair of similar gas diodes may be respectively considered as voltage regulators, a capacitor connection therebetween is a disturbing factor. A line 30 (Fig. 2) from the conductor 8 to the gas diode 15 in-parallel with a line 31 to the gas diode 18 has a circuit therefrom completed to the line 9 by respective connections 32, 33. The resistors 14, 17, in the lines 30, 31, have the capacitor 21 therebetween on the sides of the resistors toward the gas diodes.

With the application of power to the terminals 12, 13, either the gas diode 15 or the gas diode 18 may ionize first. If the gas diode 15 ionizes first, the potential at the gas diode 15 end of the resistor 14 falls to the voltage regulator value, carrying the gas diode 15 end of the capacitor 21 to the same value. The capacitor 21 was initially without charge, and the instantaneous charge, flowing through the resistor 17 from the capacitor 21 to the line 8, lowers the potential at the gas diode 18 nearly to the same potential as that of the gas diode 15 which is then conducting. The capacitor 21 at the gas diode 18 charges through the resistor 17 toward the potential of the line 8, causing the potential at the gas diode 18 to increase in value. This charging action continues until the potential at the gas diode 18 is of sufficient value to ionize the gas diode 18.

When the gas diode 18 ionizes, the potential at the gas diode 18 falls to the voltage regulator value carrying the gas diode 18 end of the capacitor 21 to the same value. Since the capacitor 21 has a difference of potential across its terminals, the gas diode 15 end of the capacitor 21 is forced below the voltage regulator potential of the gas diode 18 by an amount equivalent to the potential difference across the capacitor 21, thereby lowering the potential at the gas diode 15 below the minimum conducting potential and the gas diode 15 de-ionizes. The capacitor 21 at the gas diode 15 now charges through the resistor 14 toward the potential of the line 8 until the potential at the gas diode 15 is sufficient to ionize the gas diode 15, thus completing a cycle.

Electrically similar gas diodes are quite sensitive as to disturbances affecting identity. Commercially such departures may be as much as 10%, say as arising from variations in electrode structures and gas pressures. As matching conditions are developed, such are desirable in thereby minimizing selector problems of the resistors.

*Built-in impulse interval*

The time cycle of operation (Fig. 2) depends upon the supply voltage and the values of the resistors and the capacitor or condenser. The minimum voltage, for functioning as herein disclosed, is at least such as to rise to the ionization potential of the gas diodes. The maximum voltage may be considerably in excess thereof. With a given fixed supply potential, the fastest cycle of operation depends upon the de-ionization time of the gas diodes. If the resistors and capacitor are of sufficient reaction that the succeeding or follower gas diode is ionizing while its predecessor is being forced to de-ionize, then stalling does not occur.

A blinking rate of three flashes per second is obtained with a supply potential of 105 volts, the resistors 14, 17 being of 10 megohms each, and the capacitor 21 of .1 microfarad.

The wiring structure (Fig. 2), for a direct current flowing from the line 9 through the gas diode 15 and the resistor 14 to the line 8, has a 50 volt drop across the gas diode 15 while it is conducting. The capacitor 21 at the gas diode 15 is likewise at 50 volts. The capacitor 21 at the gas diode 18 has momentarily a potential of 50 volts, as the gas diode 15 started conducting, then the capacitor 21 starts charging through the resistor 17 toward the potential of the line 8 carrying the gas diode 18 along in potential. When the potential of the capacitor 21 at the gas diode 18 rises to 75 volts, the gas diode 18 ionizes and the potential at the gas diode 18 falls to 50 volts. At the instant of ionization of the gas diode 18, the capacitor 21 has a difference of potential of 25 volts across its terminals, and its gas diode 15 end must fall in potential to 25 volts, the 50 volt potential at the gas diode 18 minus the 25 volt potential difference across the capacitor 21 leaving 25 volts at the gas diode 15. This, being below the minimum conduction potential for the gas diode 15, results in the forced de-ionization of the gas diode 15. The capacitor 21 now has its gas diode 18 end at 50 volts and its gas diode 15 end at 25 volts, and with the gas diode 15 de-ionized, the capacitor 21 will start charging through the resistor 14 toward the potential of the line 8 until such time as the potential at the gas diode 15 is sufficient to ionize the gas diode 15 and to force the de-ionization of the gas diode 18, thus completing a cycle of operation.

The rate at which the conditions reverse in operation completes a cycle, and the repetition of such cycles of flashing, as the gas diodes disclose neon illumination during conduction, depends upon the values of the resistors 14, 17, the capacitor 21, and the supply voltage.

The gas diode pair assembly, in its capacitor and resistor control grouping, has a range of utility adaptation, such as for highway traffic warnings, for intersection passing schedules, for infant entertainment, even as a substitute for "baby sitter," miniature airplane with flashing lights, or effigies, as of a dwarf with alternating flashing eyes. Capacitor control, or battery-like reserve, has been experienced of multi-flash carry-through after the supply voltage and current have been disconnected, as for carrying-on of the cycles for as long as five or more minutes after the cutting off of the power supply.

*Flip flop potential cycle*

With 1/25 watt gas diodes 15, 18, flip flop cycles (Fig. 1) are carried through with uniformity from the impulse transmitter connection 25, having the second capacitor 24 of .01 microfarad, when the supply potential has been in the range of 75 to 105 volts. With 105 volts for the potential on the lines 8, 11, the switch 10 is momentarily opened to disconnect the line 11 from the line 8 and thereby render all of the gas diodes 18 conducting and all of the gas diodes 15 non-conducting. With the gas diode 18 conducting, there is a difference of potential in the range of 22 volts across the resistor 22, about 50 volts across the gas diode 18 and some 33 volts across the resistor 20 completing the circuit to the line 9. The resistors 22, 14, acting as a potential divider, hold the potential at the gas diode 15 to around 98 volts, and the potential difference across the gas diode 15 at some 65 volts, or less than the approximately 75 volts required for ionization of the gas diode 15.

An impulse to the connection 25 acts across the resistor 20 to raise the potential to a higher value than said 33 volts. Only the conducting gas diode is affected by the impulse. The impulse acts through the gas diode 18, forcing the gas diode 18 toward de-ionization and at the same time acting through the capacitor 21, momentarily undiminished, to raise the gas diode 15 to the ionization potential. The gas diode 15 ionizes with a drop in potential to some 83 volts and the fall in potential at the gas diode 15 reacts back through the capacitor 21 to force the complete de-ionization of the gas diode 18. The circuit stabilizes itself through the resistors 22, 14, network with the gas diode 15 conducting and the gas diode 18 non-conducting.

With the next impulse transmitted to the connection 25, the same action takes place through the conducting gas diode 15 and the capacitor 21 to establish conduction through the gas diode 18 and to react back through the capacitor 21 to make the gas diode 15 non-conducting. During this operation when the gas diode 18 is made conducting and the gas diode 15 non-conducting, the impulse transmitted from the gas diode 15 through the capacitor 21 to the gas diode 18 also operates on the coupler gas diode 27 and its capacitor 28 in parallel with resistor 29 to transmit or couple the same impulse to the junction 57 at the flip flop 2. The gas diode 27 ionizes only on the impulse and de-ionizes immediately thereafter by virtue of the capacitor 28 in parallel with resistor 29.

The impulse transmitted by the coupler from the flip flop 1 to the flip flop 2 operates on the flip flop 2 in the same manner as did the second impulse transmitted to the connection 25 act on the flip flop 1.

No impulse transmission takes place through the coupler gas diode 27 and its resistor 29 in parallel with capacitor 28 when the gas diode 18 is forced into the non-conducting state.

Following through the successive impulses transmitted to the connection 25, only when the gas diodes 18 in the flip flop stages are forced into conduction, are impulses transmitted through the couplers to the following stages of the flip flop. Thus each stage of the flip flop divides by two the number of impulses it receives to the impulses it transmits through the coupler to the next stage of the flip flop. This is herein a binary scaling, or notation, or division by two.

*Notation*

The gas diodes (Fig. 1) are assembled for direct reading or disclosing the count of the number of impulses imposed at the terminal 23 through the capacitor 24 on the line 25. To such end in the flip flop 1, the gas diode 15 has the notation "1" 34; in the flip flop 2, the gas diode 15 has the notation "2" 35; in the flip flop 3, the gas diode 15 has the notation "4" 36, and the flip flop 4, the gas diode 15 has the notation "8" 37.

Momentary opening and closing of the switch 10 renders all of the gas diodes 15 non-conducting and all of the gas diodes 18 conducting. This is the condition for Zero.

The first impulse transmitted to the terminal 23 through the capacitor 24 to act on the line 25 renders the gas diode 15 of the flip flop 1 conducting with the notation 34 luminous for "1," and the gas diode 18 non-conducting. The second impulse to the terminal 23 acts on the flip flop 1 to render the gas diode 18 conducting and the gas diode 15 non-conducting. This makes the notation 34 non-luminous. At the same time, transmission through the gas diode 27 and the resistor 29 in parallel with capacitor 28 of the coupler 5 renders the gas diode 15 of the flip flop 2 conducting and its notation "2" 35 luminous.

The gas diode 18 of the flip flop 2 is now non-conducting. The third impulse to the terminal 23 renders the gas diode 15 conducting and its notation "1" 34 luminous, the gas diode 18 at the flip flop 1 being now non-conducting. The notation "2" 35 at the flip flop 2 and the notation "1" at the flip flop 1 also being luminous, total to disclose Three.

Following through on this schedule, the fourth impulse to the terminal 23 at the flip flop 1 results in making the gas diodes 15 in the flip flops 1, 2 non-conducting and the gas diode of the flip flop 3 conducting, disclosing as luminous the notation "4" 36.

The fifth impulse to the terminal 23 renders luminous or conducting the gas diode 15 notation "1" 34, which along with the notation "4" at the flip flop 3 as still luminous totals for the count of Five.

Impulse six darkens "1" 34 notation at the flip flop 1 and renders luminous the notation "2" at the flip flop 2, which with the luminous notation "4" of the flip flop 3 is a total of Six.

Impulse seven renders the notation "1" 34 of the flip flop 1 luminous, which along with the luminous notation "2" 35 and "4" 36, displays the count Seven.

Impulse eight renders non-luminous the notations "1," "2," "4," of the flip flops 1, 2, 3, and causes the flip flop 4 notation "8" 37 to be luminous.

The series of four flip flops 1, 2, 3, 4, may thus carry through in counting to Fifteen. The sixteenth count will operate to return the system to the same or starting condition as for Zero count.

The wiring structure (Fig. 1) thus may be operated as a binary counter or scaler for each stage of the flip flop to transmit to the succeeding stage of flip flop one half of the total number of impulses acting upon its input terminal.

Thus for eight impulses transmitted to the flip flop 1, four impulses are transmitted to the flip flop 2, two impulses are transmitted to the flip flop 3 and one impulse to the flip flop 4.

*Special notation sequence*

The notation carry-through (Fig. 1) is for cumulative succession. Control therebeyond, say for placing in decimal or Tens course is provided (Fig. 3). To this end there is an inverted flip flop 38, and couplers 39, 40, 41, 42. From the power supply line 8, a line 43 is connected to the gas diode 18 in the flip flop 38, and from the electric current supply line 11, a line 44 is connected to the gas diode 15 in the flip flop 38.

The line 26 from the flip flop 4 extends to the coupler 39. From the flip flop 1, the line 26 has a branch line 46 to the coupler 40. The coupler 40 has from its gas diode 27 a line 47 connected through resistor 20 to a line 48 in the flip flop 38 between the resistor 17 and the gas diode 18. The coupler 5 has from its gas diode 27 a line 49 connected through resistor 20 to a line 50 in the flip flop 38 between the gas diode 15 and the resistor 14.

From the flip flop 4, the line 26 has its branch line 46 to the coupler 41 with a line 51 therefrom to a junction 52 at the flip flop 38. From the junction 52 there is a resistor 20 connected by a line 53 to the line 9.

At the flip flop 4 between the gas diode 15 and the resistor 14 is a line 54 extending to the coupler 42 from which a line 55 connects to the line 51. From the coupler 40 a line 56 extends to the junction 57 in the flip flop 4.

For a 105 volt direct current potential supply at the terminal 12 as measured to the line 9, line 48 in the flip flop 38 has a potential in the range of 55 volts with the gas diode 18 conducting, and a potential at line 50 around 40 volts with the gas diode 15 non-conducting.

In practice, momentary opening of the switch 10 serves to reset the wiring structure counter with the gas diodes 18 in the flip flops 1, 2, 3, 4, 38, conducting. At the junction 57 of flip flop 4 a potential of 33 volts reacts through the line 56 across the capacitor 28 in parallel with resistor 29, at the coupler 40, while the 55 volts on line 48 in the flip flop 38 reacts through the resistor 20 connected by the line 47 to the coupler 40, bringing the potential at the gas diode 27 of the coupler 40 to a value between 55 and 33 volts, which is too high a potential for the gas diode 27 in the coupler 40 to conduct impulses from the flip flop 1 through line 56 to the junction 57 of the flip flop 4.

With the gas diode 15 of the flip flop 38 non-conducting, the potential in the line 50 is around 40 volts and acts though the resistor 20 and the line 49 to the gas diode 27 of the coupler 5, while the junction 57 of the flip flop 2 is around 33 volts and has connection to the capacitor 28 in parallel with resistor 29, side of the coupler 5, for the potential at the gas diode 27 to be between 40 and 33 volts, or low enough for the gas diode 27 in the coupler 5 to conduct impulses from the flip flop 1 to the junction 57 of the flip flop 2.

For counting to and including Seven, the wiring structure (Fig. 3) operates as does the wiring structure (Fig. 1). Impulse eight into the terminal 23, through the capacitor 24 to the line 25 renders non-luminous and non-conducting the notations "1" 34, "2" 35 and "4" 36, and renders luminous or conducting the notation "8" 37.

As the gas diode 15 notation "8" 37 of the flip flop 4 becomes conducting, and thereby luminous, impulse transmission takes place through the coupler 42 on the line 51 to the junction 52 of the flip flop 38, rendering the gas diode 15 at the flip flop 38 conducting and the gas diode 18 at this flip flop 38 non-conducting. The potential of the line 50 becomes 55 volts and the potential of the line 48 becomes 40 volts with the potential of the gas diode 27 of the coupler 40 now between 40 and 33 volts, and with the potential at the gas diode 27 of the coupler 5 now between 55 and 33 volts. The gas diode 27 of the coupler 40 can now conduct impulses from the flip flop 1 through the line 56 to the junction 57 of the flip flop 4, while the potential of the gas diode 27 of the coupler 5 is too high for impulse transmission from the flip flop 1 through the coupler 5 to the junction 57 of the flip flop 2. This condition has been established (Fig. 3) by count Eight.

At the count of Nine, the gas diode 15 notation "1" 34 of the flip flop 1 becomes luminous or conducting and the gas diode 18 becomes non-conducting, which along with the luminous notation "8" 37 totals for the count Nine.

The tenth impulse in the line 25 renders the gas diode 15, flip flop 1, non-conducting and the gas diode 18 conducting, thereby blanking out the notation "1" 34. The impulse from the flip flop 1 acts through the coupler 40 on the line 56 to the junction 57 of the flip flop 4 to render the gas diode 15 notation "8" 37 non-conducting and the gas diode 18 conducting. Impulse transmission thus to the flip flop 4 acts on the line 26 through the couplers 39, 41. The coupler 41 conducts the impulse to the line 51 to the junction 52 of the flip flop 38 to render the gas diode 18 conducting and the gas diode 15 non-conducting.

The coupler 39 may conduct the tenth impulse to a successive similar wiring structure (Fig. 3) to show the count Ten, which may be even as analogous to unity on such structure.

It is to be noted that there is now non-luminous disclosure throughout on this structure and that the structure is now at Zero for further counting to be started, whether such may be Eleven or commencing again at unity.

The flip flop 38 and the wiring therefrom effectively bypass the flip flops 2, 3, (Fig. 3) by the connection of the flip flop 1 to the flip flop 4 on the count Eight, and by the reconnection of the flip flop 1 to the flip flop 2, on the count of Ten.

Commercially similar gas diodes may be adopted for the wiring structure. To such extent similar reference characters are used for capacitors and resistors approximating similar ratings. For helpful guidance electric current illustrative features are set up, say, as away from amperage and other types of units, potential, resistance and capacity, and using terms of volts, ohms and farads. The electric current supply is mentioned as positive for the supply conductor terminal 12, and negative for the take-off conductor terminal 13. As within the scope of the invention, the terminal 12 could be negative and the terminal 13 positive. However, in the preferred control course to be carried through herein, the terminal 23 for the impulse is to be positive if the terminal 12 be positive and negative if the terminal 12 be negative.

What is claimed and it is desired to secure by Letters Patent is:

1. An electric circuit for flip flop operation comprising: three energy input supply conductors, two of said conductors being interconnected, two parallel similar branches separately connected to said two interconnected conductors, a common junction of said branches having connected thereto an impulse supply means and a resistor connecting said junction to the remaining one of said three energy supply conductors, a gas diode connected in series with a resistor in each of said branches, an in-parallel capacitor-resistor connection between said branches connected to each of said branches between said resistor and said diode therein, and a coupler impulse transmitting means connected to one of said branches.

2. An electric circuit according to claim 1 wherein said coupler impulse transmitting means comprises a gas diode connected in series with an in-parallel capacitor-resistor combination.

3. An electric circuit according to claim 2 including a plurality of said flip flop circuits connected together by said coupler means to form a binary counting device.

4. An electric wiring structure comprising a gas diode flip flop adapted for assembly in a direct electric current supply circuit of first and second conductors, said flip flop embodying a first gas diode, in series therewith a first resistor incorporated in a first branch from the first conductor, a second gas diode, in series therewith a second resistor incorporated in a second branch from the first conductor, a third resistor connecting the first and second branches from the first and second diodes on the sides thereof away from the first and second resistors, said third resistor having connection to the second conductor, and an in-parallel first capacitor/fourth resistor connecting the branches between the first and second diodes and the first and second resistors.

5. The structure of claim 4 wherein there is an impulse transmitting control connected on the side of the third resistor away from the second conductor.

6. The structure of claim 4 provided with means completing it to form a first flip flop, a second flip flop, and a gas diode coupler from between the second gas diode and the second resistor of the first flip flop to the second flip flop.

7. The structure of claim 6 wherein the second flip flop has a third resistor connection to the second conductor and the coupler is connected to said second flip flop third resistor on the side thereof away from the second conductor.

8. In an electric wiring structure having a pair of supply conductors and two circuit branches therebetween, each branch including in series a first resistor, a gas diode, and a common resistor for both branches, and an in-parallel capacitor-resistor connection between said branches connected in each branch between said gas diodes and said first resistors.

9. An electric wiring structure embodying a plurality of two-tube flip flop circuits and one-diode coupler circuits in impulse transmitting relation between each flip flop circuit, and an inverted flip flop circuit, additional one-diode coupler circuits from each side of the final two-tube flip flop circuit to said inverted flip flop circuit, and a further one-diode coupler circuit between another flip flop circuit and said inverted flip flop circuit.

10. A counting circuit comprising: a plurality of flip flop trigger circuits, each comprising two diodes connected in parallel, each diode having an input and an output terminal, a resistor connected to each said output terminal of each diode, an in-parallel resistor-condenser connection between said output terminals of said two diodes, an impulse input means connected to said input terminal of both said diodes, a common resistor for both said diodes connected to said input terminal, and a diode coupling circuit including in series therewith a second in-parallel resistor-condenser connection between successive trigger circuits connected from the output terminal of one of said two diodes to the impulse input means of the next trigger circuit.

11. A counting circuit comprising: a plurality of flip flop trigger circuits in a series, each trigger circuit comprising: two diodes connected in parallel and each diode having an input and an output, a resistor connected to each output of each diode, a stabilized connection between the outputs of said two diodes, and a common resistor and an impulse input means connected to said inputs of both of said two diodes; separate diode coupling circuits between successive trigger circuits connected from the output of one of said two diodes to the impulse input of the next trigger circuit; an inverted trigger circuit connected between two separate trigger circuits in said series, said inverted trigger circuit comprising: two diodes connected in parallel having a common input and resistor and separate outputs and resistors, and a stabilized connection between said outputs of said two diodes of said inverted trigger circuit; additional diode coupling circuits connected to the outputs of two diodes of one of said two trigger circuits for controlling said inverted trigger circuit; a further additional diode coupling circuit for connecting the output of the other of said two trigger circuits to the input means of a trigger circuit different from said other trigger circuit; and means for controlling the operation of both of the diode coupling circuits connected to the output of said other trigger circuit by the operation of said inverted trigger circuit; each of said diode coupling circuits having an in-parallel resistor-condenser in series with its diode.

12. A counting circuit according to claim 11 wherein said additional diode coupling circuits are connected to the two diodes of the final trigger circuit.

13. A counting circuit according to claim 11 wherein said different trigger circuit is the final trigger circuit.

14. A cyclic counting circuit according to claim 13 wherein said two separate trigger circuits in said series are the first and the final trigger circuits in said series.

15. A counting circuit according to claim 11 wherein said stabilized circuit in said trigger circuits comprises an in-parallel resistor-condenser.

References Cited in the file of this patent

UNITED STATES PATENTS

| | | |
|---|---|---|
| 2,310,328 | Swift | Feb. 9, 1943 |
| 2,541,041 | Crenshaw, Jr. | Feb. 13, 1951 |
| 2,558,178 | Hagen | June 26, 1951 |
| 2,575,516 | Hagen | Nov. 20, 1951 |
| 2,593,375 | Williams et al. | Apr. 15, 1952 |
| 2,604,589 | Burns | July 22, 1952 |
| 2,616,627 | Holden | Nov. 4, 1952 |
| 2,665,068 | Williams et al. | Jan. 5, 1954 |
| 2,747,111 | Koch | May 22, 1956 |
| 2,782,344 | Sharin | Feb. 19, 1957 |
| 2,839,705 | Paul | June 17, 1958 |

OTHER REFERENCES

Electronics, April 1953, pages 248 and 250, "Neon Lamp Flip-Flop and Binary Counter," Vuylsteke.